United States Patent [19]

Smith, Jr.

[11] 4,081,314

[45] Mar. 28, 1978

[54] METHOD OF MAKING A SCRATCH-RESISTANT MASK FOR PHOTOLITHOGRAPHIC PROCESSING

[75] Inventor: Carlyle F. Smith, Jr., Cayuga, N.Y.

[73] Assignee: General Electric Company, Auburn, N.Y.

[21] Appl. No.: 772,777

[22] Filed: Feb. 28, 1977

Related U.S. Application Data

[62] Division of Ser. No. 669,720, Mar. 24, 1976.

[51] Int. Cl.² .................. B44C 1/22; C03C 15/00; C03C 25/06
[52] U.S. Cl. .................................. 156/645; 156/89; 156/654; 156/663; 427/272; 427/282; 427/292; 427/309; 427/375
[58] Field of Search .................. 96/36, 36.2, 38.3; 427/259, 272, 282, 279, 292, 309, 375; 156/645, 654, 655, 656, 658, 659, 663, 89, 636, 903; 354/150, 105, 354

[56] References Cited

U.S. PATENT DOCUMENTS

| | | | |
|---|---|---|---|
| 2,347,011 | 4/1944 | Walker | 156/663 X |
| 2,559,389 | 7/1951 | Beeber et al. | 156/663 X |
| 3,887,421 | 6/1975 | Hudson et al. | 427/259 X |
| 3,895,147 | 7/1975 | Ahn et al. | 96/38.3 X |
| 3,956,052 | 5/1976 | Koste et al. | 427/272 X |

*Primary Examiner*—William A. Powell
*Attorney, Agent, or Firm*—R. J. Mooney; S. B. Salai

[57] ABSTRACT

Disclosed is a photomask and a method for the manufacture thereof. A metal stencil is disposed on a glass substrate such that only preselected areas of the glass which are to be made opaque are exposed. A grit-etch step follows in which depressions are formed in the glass substrate in the preselected areas. Fusible masking material is sprayed in the depressions through the metal stencil. The masking material is preferably in particulate form in a volatile carrier liquid. The carrier liquid is preferably first driven off and, then, the combination is exposed to a relatively high temperature that fuses the masking material to the substrate.

14 Claims, 5 Drawing Figures

METHOD OF MAKING A SCRATCH-RESISTANT MASK FOR PHOTOLITHOGRAPHIC PROCESSING

This is a division of application Ser. No. 669,720, filed Mar. 24, 1976, entitled, "Scratch Resistant Mask For Photolithographic Processing."

BACKGROUND OF THE INVENTION

This invention relates generally to photolithographic masks and, more particularly, to masks used in processes such as semiconductor device manufacture.

The manufacture of semiconductor devices usually entails several photomasking steps to define and isolate portions of semiconductor surfaces in diffusion, etching and plating processing. Generally, the surface of a semiconductor wafer is covered with photoresist which is in turn covered with a photolithographic mask (hereinafter referred to as a photomask). The combination is then exposed to light and the regions of the photoresist which are exposed through the mask are polymerized. The photomask performs the function of transmitting the light in selected, well-defined areas while blocking light from the remainder of the areas, thus causing a photomask-patterned latent image to be formed in the photoresist layer. During exposure, the photomask is usually located in intimate juxtaposition or even in direct contact with the photoresist-coated surface. Next, the combination is exposed to a reagent which dissolves the non-polymerized photoresist but to which the polymerized photoresist is resistant. The remaining photoresist, comprising an image of the photomask, then serves a purpose; such as, for example, selectively protecting underlying material from attack by liquid or gaseous etchants.

Conventional photomasks used in semiconductor processing are generally formed by selectively locating a photographic emulsion on a glass substrate. A problem encountered with such masks is that the relatively soft emulsion is easily scratched in handling or when using, thus shortening the period of utility of the photomask. Efforts to solve this problem have been made in the past. For example, masks were fabricated by fusing hard, glassy masking material to a glass substrate, see U.S. Pat. Nos. 3,743,417 and 3,816,223. Some improvement was realized, but the opaque mask material was still prominently positioned and thus susceptible to injury. Further improvement was therefore desired.

An object of this invention, therefore, is to provide a photomask that is more resistant to damage than those photomasks heretofore known and to provide a method to make the subject mask.

SUMMARY OF THE INVENTION

This invention is characterized by a photomask comprising a glass substrate with depressions in selected regions of one surface thereof with an opaque ceramic glaze or other masking material fused into the depressions. The thickness of the glaze masking material is less than the depth of the depressions and only a narrow peripheral portion around each region of masking material is coplanar with the glass surface. The remainder of the surface of the masking material is depressed with respect to the major surface of the mask. Thus, the opaque masking material is less likely to be scratched, and in the event that the hard glass substrate of the subject mask becomes scratched, the mask can often be restored by lapping the major surface to remove the damage from the substrate.

The subject photomask is manufactured by positioning a metal stencil on one of the major surfaces of a glass substrate such that only preselected areas of the substrate are exposed. A grit etching step follows to form depressions in the preselected areas. Next, a ceramic masking material, such as a fusible ceramic glaze, is sprayed into the depressions. The metal stencil is then removed. Finally, the combination is heated to fuse the masking material to the substrate. Following the fusing step, it may be preferable to lap and polish the major surface to assure that the peripheral portions of the masking material are coplanar with the major surface of the substrate.

DESCRIPTION OF THE DRAWINGS

These and other features and objects of the present invention will become more apparent upon a perusal of the following description taken in conjunction with the accompanying drawings wherein.

DESCRIPTION OF THE PREFERRED EMBODIMENT AND METHOD

Figure 1:
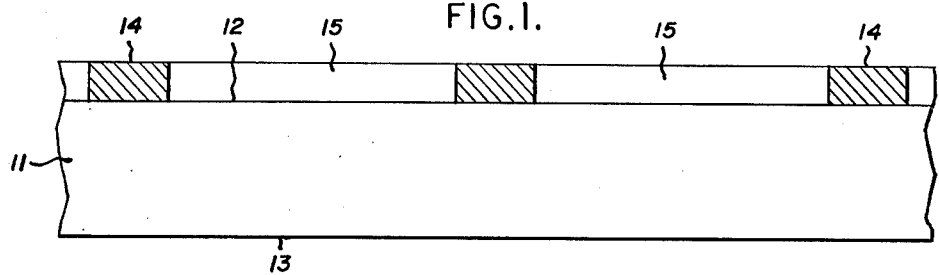
FIG. 1 is a sectional elevation view of a portion of a glass substrate with a metal stencil positioned thereon.

Referring first to FIG. 1, the fabrication of the subject photomask will be described. A glass substrate 11 defining two smooth, substantially parallel major surfaces 12 and 13 is provided. The glass 11 is preferably optical quality photographic plate glass of the type that is commercially available from companies such as the Eastman Kodak Company of Rochester, N.Y. A metal stencil 14 is positioned on the surface 12 as illustrated in FIG. 1. The stencil defines openings which leave exposed preselected areas 15 of the major surface 12. It should be realized that the metal stencil is essentially a negative of the preselected areas 15 that are to be rendered opaque in the finished photomask.

Figure 2:
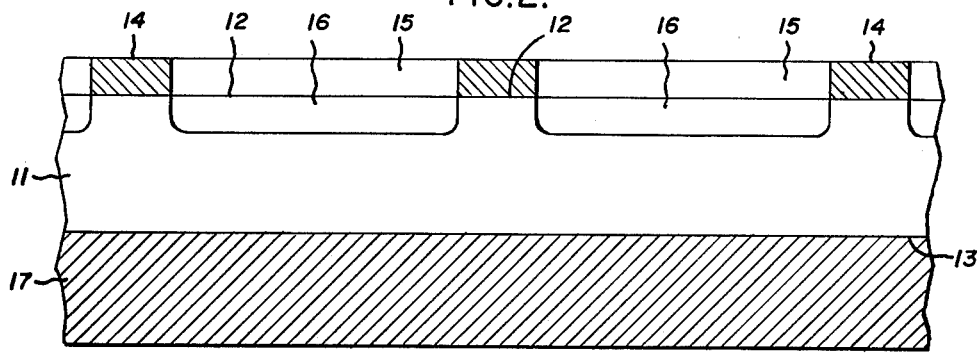
FIG. 2 is a view similar to FIG. 1 wherein the stacked combination of FIG. 1 has been placed on a clamping magnet and support and subjected to a grit etching step.

The results of the next following step are illustrated in FIG. 2. The preselected areas 15 are grit etched to form depressions 16 in the major surface 12. The grit etching is performed with commercial grit etch machines which are commonly used in semiconductor manufacture. It has been found that a good mask will be provided if the depressions are in the range of 2 to 4 mils deep. Furthermore, it is preferable to grit etch with as fine a material as practicable, such as with 400 mesh aluminum oxide grit.

FIG. 2 also illustrates an advantageous method of maintaining the stencil mask in its proper position. If the metal stencil 14 is composed of a ferromagnetic material and the glass substrate 11 and stencil 14 are placed in a stacked relationship on a clamping magnet support 17, the metal stencil will be firmly held in position.

If desired, the stencil 14 can now be temporarily removed to facilitate cleaning the grit medium and other detritus from the substrate 11. If the mask 14 is removed, care must be taken to assure precise realignment before proceeding with the following steps.

Figure 3:
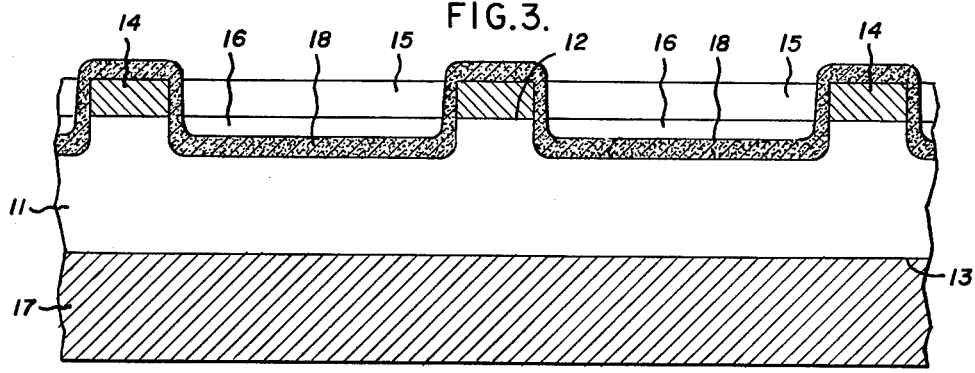
FIG. 3 illustrates the combination of FIG. 2 following the deposition of particulate masking material thereon.

Fusible optical masking material 18 is deposited in the depressions 16 as illustrated in FIG. 3. The fusible masking material 18 can advantageously be sprayed into the depressions and can consist of a ceramic material such as a ceramic glaze material compatible with the glass substrate. It, advantageously, can be a commercially available glass decorating glaze material in a particulate form dispersed in a volatile carrier liquid. For example, Matthey-Bishop V-2806 Black Glaze Powder can be employed as the optical masking material. The optical masking material must be opaque when fused, but only necessarily opaque with respect to the particular radiation which is intended to be used to polymerize the photoresist during processing utilization of the subject mask.

A preferable method of depositing the fusible glaze material is by conventional wet spray application techniques. For instance, the particulate glaze material is mixed and diluted with the carrier liquid as necessary to facilitate its use in commercially available spraying apparatus. For example, when using a Paashe Airbrush with a No. 1 Spray Tip, the glaze can advantageously be prepared by mixing 48 grams of the glaze powder with 12 milliliters of Matthey-Bishop G-4134 Screening Medium and thoroughly mixing the resulting material with 4 milliliters of xylene. Finally, the glaze is diluted to 100 milliliters with clean trichlorethylene. The mixture is then sprayed through the mask into the depressions 16 by conventional airbrush techniques. Next, the stencil 14 is removed and the substrate 11 is removed from the magnetic body 17.

A heating step which fuses the optical masking material to the substrate and into a coherent body follows. Preferably, the heating step comprises a prebake step to drive off the liquid carrier. Preferably, the assembly is air-dried for 2 hours, baked out for 2 hours at 110° C, and thoroughly baked again at 210° C for 12 or more hours. Subsequently, the final heating step is carried out for a time and temperature commensurate with the fusion characteristics of the particular masking material.

The final heating step is preferably accomplished in a tunnel oven set to provide a slow rise of about ½ hour to the fusion temperature, and a slow cool of about one hour from the fusion temperature. A time of 15 minutes or more at fusion temperature in the range of 400° to 650° C is typical. The precise temperature and time used to fuse the glaze into a continuous pinhole-free surface and to bond the glaze to the glass substrate will depend on the masking material 18 used. For example, when using the Matthey-Bishop compound cited, a temperature of 500° to 520° C for a period of approximately 15 minutes to 1 hour has been found to give the desired result. Preferably, the glaze firing temperature is no greater than the annealing temperature of the glass substrate.

Figure 4:
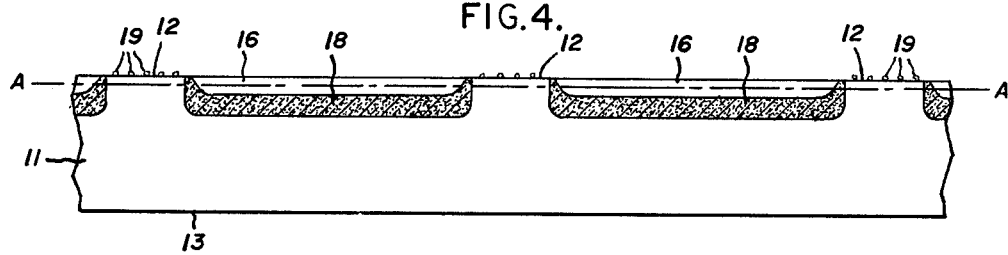
FIG. 4 is an elevation view of the subject photomask following the removal of the metal stencil and the subsequent fusing of the ceramic glaze masking material to the substrate.

As is shown most clearly in FIG. 4, which illustrates the mask following removal of the stencil 14 and the heating step, the optical masking material 18 forms a meniscus around the periphery of the depression. Furthermore, as shown in FIG. 4, small particles 19 of the masking material may inadvertently come in contact with and be fused to the major surface 12 in areas removed from the depressions 16. Clearly, these small opaque particles are deleterious to the operation of the mask. Thus, it is helpful to subject the major surface 12 to a lapping and polishing step following the fusing heat treatment. Preferably, the subject mask is lapped to approximately the level of the broken line A — A in FIG. 4. The lapping is by conventional procedures such that approximately ½ to 1 mil of material is removed from the major surface 12.

Figure 5:
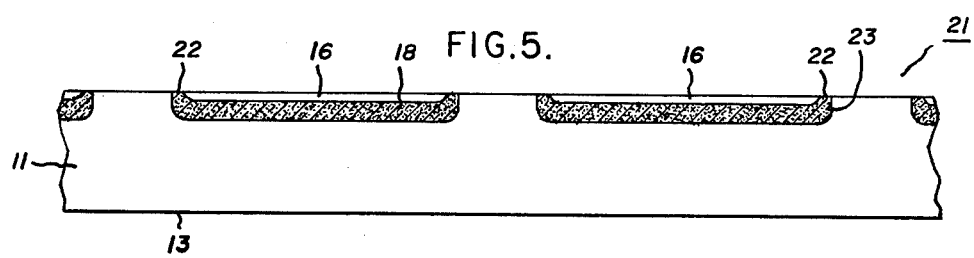
FIG. 5 is a sectional elevation view of a lapped, finished photomask in accordance with the subject invention.

A finished photomask 21 made in accordance with the subject invention is shown in FIG. 5. It will be appreciated from an observation of FIG. 5 that the depressions 16, even after the major surface 12 has been lapped to the final level, denoted 12', are still deeper than the fused, densified masking material 18 is thick. Thus the surface of the masking region, except for a narrow peripheral portion 22 of each region, is depressed with respect to the surface 12'. The only area of the surface of each body of optical masking material that is coplanar with respect to the surface 12' is the narrow peripheral portion 22 which serves as a light sealing rim and thus assures that when the surface 12' is placed adjacent photoresist to be exposed, a reliable light seal is created around the desired periphery of the masked area. It will further be appreciated that the junction between the glass substrate 11 and the optical masking material 18, where exposed, is substantially perpendicular to the surface 12', thus minimizing refraction and reflection problems and further assuring accurate exposure of the photoresist. Furthermore, the perpendicularity of the substrate-masking material interface 23 to the surface 12' assures the minimization of diffraction effects.

Many process modifications are within the scope of this invention. For example, if the heating step utilized to fuse the glazing material to the substrate is approximately at the annealing temperature of the glass, it is helpful to anneal the substrate prior to the grit-etching step. Photographic glasses of the type cited have been found to anneal at approximately 515° to 525° C. The temperature required to fuse the glaze is determined by the chemical composition and is ordinarily contained in the information supplied by the glaze maufacturer. In the above example, utilizing the Matthey-Bishop Glaze, it is helpful to anneal the glass substrates on a flat plate for a time sufficient to relieve internal stresses, generally about an hour, prior to grit etching. It is also useful to lap the first major surface 12 following the annealing process but prior to the grit-etching step so that the metal stencil will form a better seal.

Another useful process modification is to lightly chemically etch the substrates in a buffered hydrofluoric acid, following the grit etch. The acid will remove any small clinging particles of glass that were not completely removed by the grit etch. The chemical etch will further eliminate much of the surface damage caused to the substrate by the grit etch. It will be appreciated, of course, that if the chemical etch is desired, the metal stencil 14 may be temporarily removed and then replaced prior to the spraying of the optical masking glaze coating.

Other glass substrates can be used. If a low temperature glaze is desired, a low temperature glass which handles well and anneals at about 300° C could be used. Or, if a higher temperature glaze is used, it can be used with a higher temperature substrate such as fused quartz which anneals at about 1000° C or more and shows good transmission in the ultraviolet-visible spectrum.

Another advantage of the mask manufactured as described above is that the bottoms of the depressions 16, being formed by grit etching, are relatively rough, even when etched as described above, and thus the opaque areas, when viewed from the surface 13 have a matte, rather than glossy finish. Thus, when the mask is illuminated from the surface 13 during use, light is scattered, rather than reflected, by the opaque areas. Therefore, inadvertent exposure of photoresist is less likely to occur. The matte finish effect is enhanced if some voids remain between the bottom of the depressions and the mask material 18.

Many other modifications and variations of the subject invention will be apparent to those skilled in the art. For example, the masking material can be rolled or brushed into the depressions. It is to be understood, therefore, that the invention can be practiced otherwise than as specifically described.

What is claimed is:

1. A method of making a photomask comprising the steps of:
    providing a glass substrate defining two smooth, substantially parallel major surfaces;
    positioning a stencil on one of said major surfaces, said stencil defining openings in preselected areas;
    grit etching said substrate to form depressions at said preselected areas;
    depositing in said depressions, through said stencil, a fusible ceramic optical masking material;
    removing said stencil; and
    heating said substrate to fuse said masking material into a coherent, opaque layer bonded thereto.

2. A method according to claim 1 wherein said depressions are made deeper than the anticipated thickness of said coherent, opaque layer.

3. A method according to claim 2 comprising the additional step of lapping said one major surface after said heating step.

4. A method according to claim 3 comprising the additional step of polishing said one major surface after said lapping step.

5. A method according to claim 3 wherein said optical making material is a ceramic decorative glaze material for glass.

6. A method according to claim 1 wherein said optical masking material is a ceramic decorative glaze material for glass.

7. A method according to claim 6 wherein said glaze material is in particulate form and is in a volatile carrier liquid.

8. A method according to claim 7 wherein said heating step comprises a prebake step for driving off said carrier liquid.

9. A method according to claim 7 wherein said heating step comprises heating said substrate to a temperature in the range of about 300° to about 1000° C for a time of at least about 1 hour.

10. A method according to claim 1 wherein said step of providing a substrate comprises the step of annealing said substrate.

11. A method according to claim 10 wherein said step of heating said substrate is carried out at a temperature not exceeding the annealing temperature of said substrate.

12. A method according to claim 10 wherein said step of supplying substrates further comprises the step of lapping and polishing said one surface following said step of annealing.

13. A method according to claim 1 wherein said stencil is ferromagnetic and said substrate and said stencil are placed in a stacked relationship on a clamping magnet support.

14. A method according to claim 1 comprising the further step of lightly chemically etching said substrate following said step of grit etching.

* * * * *